United States Patent [19]

Bowers

[11] 4,440,538
[45] Apr. 3, 1984

[54] APPARATUS FOR LOADING AND UNLOADING A FURNACE

[75] Inventor: Gerald M. Bowers, Boonville, Calif.

[73] Assignee: Atomel Products Corporation, Sunnyvale, Calif.

[21] Appl. No.: 335,853

[22] Filed: Dec. 30, 1981

[51] Int. Cl.³ .......................................... H01L 21/324
[52] U.S. Cl. ..................................... 414/183; 414/786
[58] Field of Search ............... 414/150, 180, 182, 184, 414/183, 786

[56] References Cited

U.S. PATENT DOCUMENTS 3,870,510 3/1975 Martin et al. ................... 414/184 X
3,889,821 6/1975 Bowers et al. .
4,008,815 2/1977 Fisk ..................................... 414/180

FOREIGN PATENT DOCUMENTS 1190477 4/1965 Fed. Rep. of Germany ...... 414/183
53-129964 11/1978 Japan ................................... 414/150

Primary Examiner—Robert J. Spar
Assistant Examiner—Janice Krizek
Attorney, Agent, or Firm—Manfred M. Warren; Robert B. Chickering; Glen R. Grunewald

[57] ABSTRACT

A device to load semiconductor wafers into a furnace when the wafers are contained in a boat, the device including a tower movable horizontally on rails and a ram mounted on the tower to be independently movable horizontally so that the joint movement of the ram and the tower provide a telescoping effect, the ram also being tiltable in a vertical plane to a position with its end higher than the portion attached to the tower whereby a boat carrier held on the end of the ram in its tilted position can be placed in the furnace, lowered into contact with the furnace floor by moving the ram to a horizontal position and then retracted without causing sliding of the boat carrier against the furnace floor.

3 Claims, 4 Drawing Figures

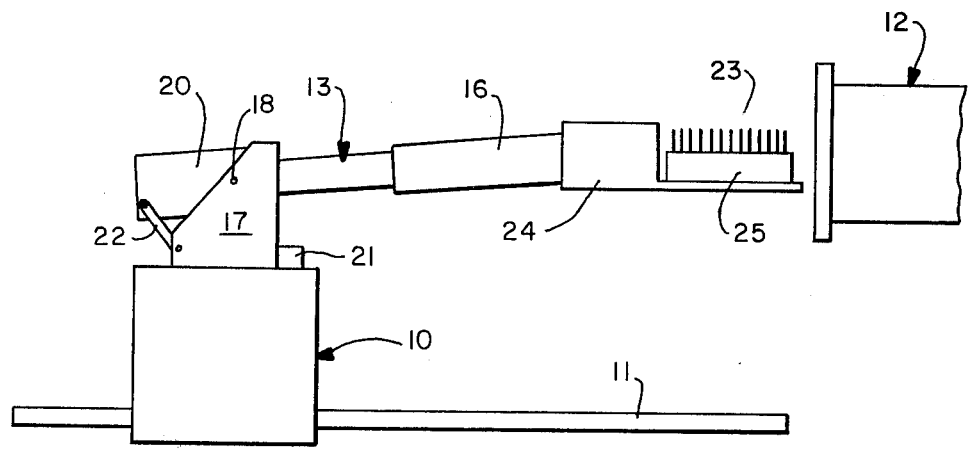
FIG.—1
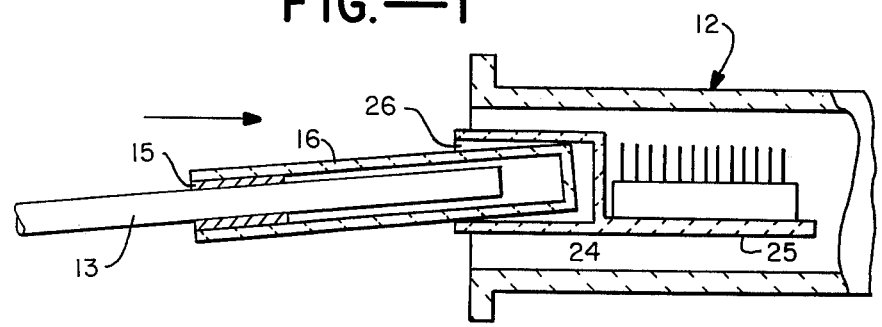
FIG.—2
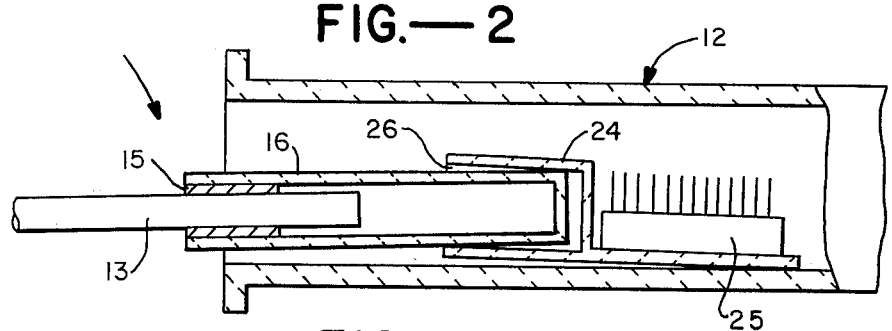
FIG.—3
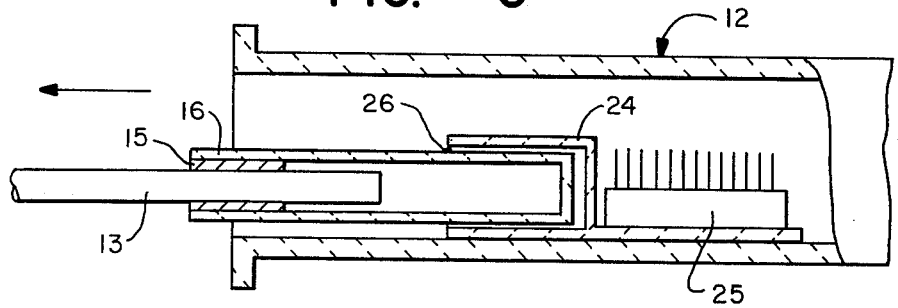
FIG.—4

APPARATUS FOR LOADING AND UNLOADING A FURNACE

BACKGROUND OF THE INVENTION

This invention deals with an apparatus for loading and unloading furnaces for processing materials such as semiconductor wafers. In preparing such material it is frequently necessary to isolate them in a vessel to heat them, oxidize them, effect diffusion or to have other physical or chemical processes performed. All of these processes, whether involved with heat, vacuum, pressure, or treatment with gas phase reactants require inserting the material to be treated into a vessel, sealing the vessel, effecting the treatment, and then removing the treated wafers from the vessel. Although this invention is not limited to any process, for the purposes of the description herein the vessel will be referred to as a furnace and the process will be described as a heating process.

Semiconductor material is extremely sensitive to impurities. Even very small amounts of contaminants can seriously influence the ability of semiconductor material to function properly. To avoid contamination of these materials extensive measures are taken to keep areas clean where the material is manufactured. The manufacture usually takes place in a clean room which is entered through an air lock, where air circulating into the room is filtered and otherwise cleaned of contaminants, where the materials of construction of the room and the equipment within it is carefully selected, and where even the apparel of the workers is controlled to avoid contaminating the product being made. Clean rooms are very expensive to build and maintain on a square foot basis and economy of using floor space is very important.

Even with the precautions taken in a clean room, contaminants are sometimes generated by the manufacturing process itself. Abrasion caused by sliding of parts against one another can generate particles. Usually contamination caused by abrasion can be controlled in a clean room by carefully avoiding exposing sensitive materials to such contamination. However, there are some areas where it is very difficult. One such area is the interior of a furnace in which wafers of semiconductor material are heated.

Wafers of semiconductor material are usually loaded into a furnace by first being loaded into a device called a boat. In a boat each wafer is held in its desired position out of contact with adjacent wafers. When the boat is loaded it is placed on a carrier which usually has a long paddle-like element on which one or more boats are carried. The carrier is then pushed into a furnace so that the wafers contained in the boats can be treated. Even though the boat carrier is usually made of quartz, which is not a contaminating material, abrasion caused by sliding on the furnace floor creates particles that detract from the quality of the semiconductor material. Boat carriers have been provided with skids and with wheels in an attempt to avoid producing particles by abrasion. However, even the skids cause abrasion and it is difficult to find wheels and axles that can be made from materials that withstand the conditions in the interior of this furnace or are not in themselves contaminants. In addition, even a carrier having wheels must have bearings and the bearing wear between the wheel and its axle produces particles that detract from the quality of the final product.

Another problem with making semiconductor material is avoiding crystal defects or even destruction of crystals due to thermal shock when a boat is placed in or removed from a furnace. In the past thermal shock has been avoided by creating what is known as a thermal ramp that in turn is created by pushing a boat into a furnace slowly and when processing is completed removing the boat from the furnace slowly. In order for the process to produce consistent material, it must be effected with reproduceable thermal ramps.

SUMMARY OF THE INVENTION

This invention is a device for loading and unloading a wafer-containing boat or the like, into and out of a furnace, which device solves or greatly mitigates the problems enumerated above. The device of this invention includes a support assembly in the form of a tower, and a ram mounted with respect to the support assembly so that a telescoping action is obtained by the cooperation of the tower and the ram. The tower is mounted on rails so that it can move horizontally on an axis that is parallel to the loading axis of the furnace. The device includes driving means to move the tower along the rails in a direction toward or away from the opening to the furnace.

The device also includes a ram mounted on the tower so that it moves toward and away from the furnace with the tower. In addition, the device includes means to move the ram relative to the tower, horizontally and in a direction parallel to the loading axis of the furnace. With this arrangement a device for loading and unloading a furnace by moving a load into it horizontally can provide a long horizontal thrust of the ram without consuming a corresponding amount of floor space. Thus, if the tower moves 4 feet while the ram mounted on it moves 2 feet, each in the same horizontal direction, a loading thrust of 6 feet can be obtained while providing only 5 feet of floor space for movement of the loading mechanism.

The ram is mounted on the tower so that it may be tipped from a horizontal axis to an axis where the end of the ram closer to the furnace is at the higher elevation than the other end of the ram. The ram is also mounted on the tower so that when its long axis is horizontal, it is parallel to the loading axis of the furnace but at a lower elevation. The ram is constructed so that the portion that enters the furnace during loading and unloading is made of inert material with respect to the material being processed in the furnace. Typically, the internal portions of the ram will be constructed of a metal such as stainless steel but that portion of the ram that enters the furnace will be made of a material such as quartz. A quartz sleeve on a stainless steel ram is a typical construction.

The wafers to be loaded into the furnace in accordance with this invention are loaded into one or more boats that are placed on a carrier. The boats are adapted for holding the wafers in a position suitable for processing, for example in a series of opposed vertical slots. The carrier is provided with a paddle-like structure to hold one or more boats and has means to be engaged by the loading ram. This engaging means can be as simple as a cylindrical cavity that is larger in diameter than the diameter of the quartz sleeve on the end of the ram. The ram engages the carrier when the sleeve enters the cavity and the ram is tilted with its axis non-horizontal, and disengages the carrier when the axis of the ram is horizontal and the carrier is lying on the furnace floor.

This invention includes operating the tower and ram to control the rate at which wafers are loaded into and removed from the furnace. Suitable controls may be provided to control the movement of the tower and of the ram to provide a proper thermal ramp for the material being processed.

BRIEF DESCRIPTION OF THE DRAWINGS

One device embodying this invention is illustrated in the accompanying drawings.

FIG. 1 is an elevation view of the device shown in conjunction with a partial view of a furnace to be loaded.

FIG. 2 is a partial view of the furnace and the ram when the loading process is initiated.

FIG. 3 is the device illustrated in FIG. 2 at an intermediate stage of the furnace loading process.

FIG. 4 is the device illustrated in FIG. 2 at the end of the loading process.

DETAILED DESCRIPTION OF THE INVENTION

The portion of the device described as the tower is generally designated 10. The tower is mounted on two or more rails 11 so that it may move horizontally along the rails in either direction. Details of construction of the tower 10 are those known to the prior art for a motor driven device that moves in opposite directions on rails. The horizontal axis of the motion of tower 10 is parallel to the loading axis of the furnace generally designated 12 and shown schematically and partially in the drawings. Details of construction of the furnace are not illustrated in that the furnace forms no part of this invention.

The device of this invention also includes a ram assembly generally called a ram but containing a number of elements. The ram includes a shaft 13 that may have any suitable cross-section. A moveable holder is mounted on the ram shaft 13 and is adapted to be driven, as with a belt, so that it may move longitudinally along the ram shaft 13. A quartz sleeve 16 is fixed to moveable element 15 and sleeve 16 is long enough to extend into furnace 12 to deposit wafers. The ram shaft is held on a mounting 17 which holds it pivotally on a trunnion 18 and carries a driving motor 20 to cause the moveable element 15 to move forward and back relative to ram shaft 13. Mounting 17 also includes a pneumatic cylinder 21 which is mounted through suitable linkage 22 so that operation of the cylinder 21 will cause the ram to tilt from a non-horizontal position as shown in FIGS. 1, 2 and 3 to a horizontal position as shown in FIG. 4.

The wafers to be treated with the device of this invention are indicated at 23 and they are contained in a quartz boat 25 that is carried on a quartz carrier 24 having an end cavity 26 best illustrated in FIGS. 2, 3 and 4, and a paddle-like element on which the boat rests.

In use the device of this inventiion is first arranged so the quartz sleeve 16 is retracted from the furnace and tilted to a non-horizontal position as illustrated in FIG. 1. The carrier 24 is installed on the end of the sleeve so that it is horizontal as illustrated in FIGS. 1 and 2 and one or more boats 25 are placed on it. The carrier can be installed on the end of the ram manually or with suitable devices. When the carrier is installed on the ram and one or more boats placed on it as illustrated in FIG. 1 the tower 10 is activated to move toward the furnace 12 and the ram mechanism is activated to cause sleeve 16 to extend toward the furnace while tower 10 is also moving toward the furnace. As a result, the carrier 24 enters the furnace horizontally in the direction of the arrow in FIG. 2 and eventually extends to the position it will occupy during the treatment of the wafers 23. At that point the forward motion of tower 10 and of the ram mechanism are stopped and pneumatic cylinder 21 is activated to lower the ram to a horizontal position, in the direction of the arrow in FIG. 3. As the ram is tilted to a horizontal position the front end of carrier 24 contacts the floor of the furnace 12 and as lowering of the ram continues the back end of carrier 24 also comes in contact with the floor of furnace 12 so that the carrier is simply lying on the floor of the furnace. A slight further tilting of the ram causes sleeve 16 to come completely out of contact with the interior of cavity 26 as illustrated in FIG. 4 after which the ram and the tower may be moved in the direction of the arrow in FIG. 4 so that the carrier and boat remain properly positioned in the furnace 12 while the ram is removed from the furnace 12. After positioning as illustrated in FIG. 4 the furnace can be capped and the heating or other treatment of wafers 23 can be accomplished.

Unloading boat 25 from the furnace is accomplished by the reverse of the process steps described above. When the mouth of the furnace 12 is open the ram and tower are moved forward to a position shown in FIG. 4 after which the ram is tilted first to the position illustrated in FIG. 3 and then to the position illustrated in FIG. 2 after which the ram and tower are moved away from the furnace whereby the carrier and boat are removed from the furnace while positioned on the ram as illustrated in FIG. 2.

It is evident from the foregoing description that the entire loading and unloading sequences are conducted without sliding contact between the carrier and the interior of the furnace and without the ram or any portion of protective sleeve 16 coming in contact with the furnace or even having sliding contact with the interior of the cavity 26. The device of this invention therefore loads and unloads wafers from furnace 12 without creating particles due to abrasion caused by sliding contact between surfaces.

In a preferred embodiment of the invention a control system is employed to regulate the speed of the tower and the ram driving mechanism to provide loading and unloading at a preselected rate. Thus when the boat is being placed in the furnace, the motion illustrated in FIG. 2 will be at a controlled rate to prevent damage to wafers 23 from thermal shock. However, retraction of the ram and tower, illustrated in FIG. 4, can be very rapid. When unloading the furnace the ram may be inserted into the furnace and tilted to the position illustrated in FIG. 2 very rapidly, and then withdrawn at a controlled rate to prevent thermal shock due to cooling. Mechanically driving the wafers into and out of the furnace at controlled rates lends itself to creating a thermal ramp much more reproducibly than hand loading.

In a specific example of the device of this invention, a fixed length loading rod five feet long was replaced by the device of this invention. To accommodate the rod in both retracted and extended position, and to leave enough space to mount a boat carrier on its end, eight linear feet of floor space was consumed. That device was replaced with a device embodying this invention in which the tower had a horizontal thrust of four feet and the ram had a horizontal thrust of two feet. The device of this invention provided the same loading thrust although it was contained on a table only 5.5 feet long.

More importantly, the device of this invention avoided contamination from abrasion-generated particles and created predictable and reproducible thermal ramps.

What is claimed is:

1. An apparatus for loading and unloading a furnace with wafers held in a boat carried by a boat carrier including a support assembly movable horizontally on an axis parallel to the loading axis of said furnace, a ram mounted on said support assembly and movable relative to said support assembly on an axis lying in the same plane as the loading axis of said furnace, portions of said ram adapted to enter said furnace being formed of inert material with respect to conditions in said furnace, said ram being tiltable in a vertical plane from a position with its long axis horizontal to a position with the end of said ram most distant from said support assembly at a higher elevation than the end of said ram nearer said support assembly, engaging means on the end of said ram formed to engage said boat carrier when said ram is in a tilted position and to disengage from said boat carrier when said ram is in a horizontal position, wherein the improvement in said apparatus comprises:

said engaging means being formed with an end having upwardly facing and downwardly facing surfaces formed to engage opposed surfaces of said boat carrier, said upwardly facing and downwardly facing surfaces being spaced apart and engaging said opposed surfaces on said boat carrier at substantially point contacts relative to said axis of loading of said furnace;

said end of said engaging means being further formed and dimensioned for removal from engagement with said boat carrier without contacting said boat carrier except at said point contacts; and said ram being formed and dimensioned for insertion into and for removal of said ram and boat carrier from said furnace and for insertion into and removal of said end from said boat carrier without contact of said ram with said furnace.

2. The apparatus as defined in claim 1 wherein, said end of said engaging means is formed by a cylindrical end, said boat carrier is formed with an open ended cylindrical cavity of larger diameter than the diameter of said cylindrical end to permit insertion and removal of said end from said cavity without engagement between said cavity and said end and to permit engagement of said boat carrier only at said point contacts upon tilting of said ram.

3. A process for loading a furnace with wafers held in a boat including the steps of: placing said boat containing said wafers on a boat carrier, engaging and supporting said carrier on the end of a horizontally movable support assembly and vertically tiltable ram assembly, horizontally moving and upwardly tilting said end and boat carrier by means of said support assembly and said ram assembly until said boat carrier is completely within said furnace with said end in an upwardly tilted position, downwardly tilting said end of said ram assembly to a horizontal position to rest said boat carrier on a supporting surface within said furnace to disengage said end from said boat carrier, and withdrawing said end from said boat carrier and said furnace by moving said end horizontally wherein the improvement in said loading process is comprised of:

said engaging and supporting step being accomplished by engaging said boat carrier on said upwardly tilted end by an upwardly facing surface on said end and an axially spaced downwardly facing surface on said end, the upwardly facing and downwardly facing surfaces on said engaging respective oppositely facing surfaces on said boat carrier at substantially point contacts relative to the direction of horizontal movement of said support assembly; and said withdrawing step being accomplished without contact between said end and said boat carrier after disengagement of said end from said boat carrier and without contact between said end and said furnace.

* * * * *